US007194713B2

(12) United States Patent
Iwashita

(10) Patent No.: US 7,194,713 B2
(45) Date of Patent: Mar. 20, 2007

(54) LOGIC VERIFICATION DEVICE, LOGIC VERIFICATION METHOD, AND COMPUTER PRODUCT

(75) Inventor: Hiroaki Iwashita, Kawasaki (JP)

(73) Assignee: Fujitsu Limited, Kawaskai (JP)

( * ) Notice: Subject to any disclaimer, the term of this patent is extended or adjusted under 35 U.S.C. 154(b) by 138 days.

(21) Appl. No.: 11/017,730

(22) Filed: Dec. 22, 2004

(65) Prior Publication Data

US 2006/0036983 A1     Feb. 16, 2006

(30) Foreign Application Priority Data

Aug. 13, 2004   (JP)   ............................. 2004-235852

(51) Int. Cl.
  *G06F 17/50*   (2006.01)
(52) U.S. Cl. ................. 716/5; 716/4; 716/18
(58) Field of Classification Search ............... 716/4–5, 716/18
  See application file for complete search history.

(56) References Cited

U.S. PATENT DOCUMENTS

| | | | |
|---|---|---|---|
| 6,654,935 B2* | 11/2003 | Ara et al. .................. | 716/4 |
| 7,039,574 B1* | 5/2006 | Roesner et al. ............ | 703/17 |
| 2002/0046391 A1* | 4/2002 | Ito et al. ................... | 716/18 |
| 2002/0188916 A1* | 12/2002 | Ito ............................ | 716/4 |
| 2005/0278683 A1* | 12/2005 | Roesner et al. ............ | 716/18 |

OTHER PUBLICATIONS

Carl Pixley et al, "*A Verification Synergy: Constraint-Based Verification*" Electronic Design Process Workshop, IEEE Computer Society, 2003.
Joseph Richards, "*Creative Assertion and Constraint Methods for Formal Design Verification*," Design and Verification Conference and Exhibition (DVCon) U.S.A. 2003.
Kanna Shimizu et al, "*Deriving a simulation Input Generator and a Coverage Metric from a Formal Specification*," Design Automation Conference (DAC), 2003.
Jun Yuan, et al., "*Constraint Synthesis for Environment Modeling in Functional Verification*" Design Automation Conference (DAC), 2003.
Koji Ara, et al., "*A Proposal for Transaction-Level Verification with Component Wrapper Language*," Design Automation and Test in Europe (DATE), 2003.

* cited by examiner

*Primary Examiner*—Paul Dinh
(74) *Attorney, Agent, or Firm*—Staas & Halsey LLP

(57) ABSTRACT

A logical verification device includes an input unit, a generator, an input constraint information calculator, an output constraint information calculator, an input/output constraint information calculator, a determining unit, and a logic verifying unit. The input unit inputs hardware description information and interface specification description information concerning a communication procedure of a hardware module. The generator generates a finite state machine model concerning a status transition of signals input to and output from the hardware module, based on the interface specification description information. The input constraint information calculator calculates input constraint information using the generated finite state machine model.

13 Claims, 10 Drawing Sheets

FIG.3

```
001    interface M;
002      port;
003        input.clock        clk;
004        input.control      cmd;
005        input.control      req;
006        output.control     ack;
007        inout.data[31:0]   dat;
008      endport 009      alphabet;
010        signalset all =   { clk,  cmd, req, ack,    dat };
011          R:              {  r,    0,   1,   0,     ? };
012          S(reg[31:0] D): {  r,    0,   1,   1,  out D };
013          W(reg[31:0] D): {  r,    1,   1,   0,   in D };
014          K(reg[31:0] D): {  r,    1,   1,   1,   in D };
015          IDLE:           {  r,    ?,   0,   0,     ? };
016        endsignalset
017      endalphabet 018      word;
019        read{reg[31:0] D}:  R+ S(D);
020        write{reg[31:0] D}: W(D)+ K(D);
021      endword 022      sentence;
023        FOREGROUND:
024          read;
025          write;
026        BACKGROUND:
027          IDLE;
028      endsentence
029    endinterface
```

FIG.5

| TRANSITION BRANCH | INPUT/OUTPUT CONSTRAINT INFORMATION | INPUT CONSTRAINT INFORMATION | OUTPUT CONSTRAINT INFORMATION |
|---|---|---|---|
| S0→S0 | ¬req_in ∧ ¬ack_out | ¬req_in | ¬ack_out |
| S0→S1 | ¬cmd_in ∧ req_in ∧ ¬ack_out | ¬cmd_in ∧ req_in | ¬ack_out |
| S0→S2 | cmd_in ∧ req_in ∧ ¬ack_out | cmd_in ∧ req_in | ¬ack_out |
| S1→S0 | ¬cmd_in ∧ req_in ∧ ack_out | ¬cmd_in ∧ req_in | ack_out |
| S1→S1 | ¬cmd_in ∧ req_in ∧ ¬ack_out | ¬cmd_in ∧ req_in | ¬ack_out |
| S2→S0 | cmd_in ∧ req_in ∧ (dat_in = prev_dat) ∧ ack_out | cmd_in ∧ req_in ∧ (dat_in = prev_dat) | ack_out |
| S2→S2 | cmd_in ∧ req_in ∧ (dat_in = prev_dat) ∧ ¬ack_out | cmd_in ∧ req_in ∧ (dat_in = prev_dat) | ¬ack_out |

| TRANSITION STATUS | INPUT CONSTRAINT INFORMATION | OUTPUT CONSTRAINT INFORMATION |
|---|---|---|
| S0 | 1 | ¬ack_out |
| S1 | ¬cmd_in ∧ req_in | 1 |
| S2 | cmd_in ∧ req_in ∧ (dat_in = prev_dat) | 1 |

LOGIC VERIFICATION DEVICE, LOGIC VERIFICATION METHOD, AND COMPUTER PRODUCT

CROSS-REFERENCE TO RELATED APPLICATION

This application is based upon and claims the benefit of priority from the prior Japanese Patent Application No.2004-235852, filed on Aug. 13, 2004, the entire contents of which are incorporated herein by reference.

BACKGROUND OF THE INVENTION

1) Field of the Invention

The present invention relates to a logic verification device, a logic verification method, a logic verification program, and a recording medium used to verify the logic of a hardware module such as an LSI (large-scale integration) to be verified.

2) Description of the Related Art

In designing a hardware module such as an LSI, there is conventionally a demand to shorten the design period to improve work efficiency. On the other hand, a verification work to verify whether the hardware module operates correctly is essential. Particularly, in order to maintain high quality, the verification work is important for a large-scale and highly functional hardware module requiring high speed and low power consumption.

In general, this hardware module has a plurality of input/output terminals, and their signals change for each clock cycle. A pattern of the signal change (input/output sequence) is determined according to a specification, and an optional signal cannot be obtained at an optional time. This signal change is explained below based on a hardware module.

FIG. 10 is a block diagram of one example of a general hardware module of which logic is to be verified. In FIG. 10, a hardware module M includes a clock terminal P1 that inputs a clock signal clk, a command input terminal P2 that inputs a command signal cmd, a request input terminal P3 that inputs a request signal req, an acknowledge output terminal P4 that outputs an acknowledge signal ack, and a data input/output terminal P5 that inputs/outputs a 32-bit data signal dat.

According to the specification of this hardware module M, only two patterns of a read operation and a write operation are permitted. FIG. 11 is a waveform diagram of the read operation of the hardware module M, at which operation, the data signal dat (output data outD in FIG. 11) is read. FIG. 12 is a waveform diagram of the write operation of the hardware module M, at which operation, the data signal dat (input data inD in FIG. 12) is written.

"Input constraints" express constraints that the input signal of the read operation shown in FIG. 11 and the input signal of the write operation shown in FIG. 12 must satisfy respectively. The following two input constraints are provided for the hardware module.

(1) Input Constraint of the Read Operation

When the input value of the command signal cmd is "0", when the input value of the request signal req is "1", and also when the output value of the acknowledge signal ack is "0", then the input value of the command signal cmd must be kept at "0" and the input value of the request signal req must be kept at "1" in the next cycle.

(2) Input Constraint of the Write Operation

When the input value of the command signal cmd is "1", when the input value of the request signal req is "1", and also when the output value of the acknowledge signal ack is "0", then the input value of the command signal cmd must be kept at "0" and the input value of the request signal req must be kept at "1" in the next cycle. The input value of data signal dat must also be kept at a same value.

The above input constraints (1) and (2) are essential information to verify the logic. The logic verification is a work to confirm that the hardware module M operates correctly even when the value of the signal input to the input terminal changes within a range of values that satisfy the input constraints. On the other hand, the operation to an input that does not satisfy the input constraint has no meaning of verification.

Violation of the input constraints made by the hardware module M shown in FIG. 10 is explained next. FIG. 13 is a waveform diagram of the input constraints violated by the hardware module M. When operation waveforms shown in FIG. 13 are observed, the hardware module M shown in FIG. 10 has violated the input constraint (2).

Therefore, even when the function of the hardware module M expected for the write operation (for example, to store a value of the data signal dat) is not correctly executed or when the data signal dat taken out in the subsequent read operation does not have an expected value, this must not be determined as a dyslogia of the hardware module M.

In order to correctly verify the above violation of input constraints, verification methods called a formal verification and a constraint-based verification are available, instead of a simple logic simulation. According to these verification methods, it is necessary to prepare a description of an input constraint that a computer can interpret, in addition to a description of a hardware of which logic is to be verified and a description of a verification property expressing the verification content, as inputs to a logic verification tool (see, for example, Non-Patent Literature 1: "A Verification Synergy: Constraint-Based Verification" by Carl Pixley and John Havlicek, Electronic Design Process Workshop, IEEE Computer Society, 2003, and Non-Patent Literature 2: "Creative Assertion and Constraint Methods for Formal Design Verification" by Joseph Richards, Design and Verification Conference and Exhibition (DVCon)).

According to an actual logic verification of the hardware module M, there are several hundred items in the input constraint description shown in the Non-Patent Literatures 1 and 2, and it is not easy to accurately describe every one of these items. Therefore, when there is a description of input constraints, it is possible to automatically and efficiently execute the subsequent logic verification work (see, for example, Non-Patent Literature 3: "Deriving a Simulation Input Generator and a Coverage Metric From a Formal Specification" by Kanna Shimizu and David L. Dill, Design Automation Conference (DAC), 2002, and Non-Patent Literature 4: "Constraint Synthesis for Environment Modeling in Functional Verification" by Jun Yuan, Ken Albin, Adnan Aziz, and Carl Pixley, Design Automation Conference (DAC), 2003).

Exhaustive description of input/output terminals that the hardware module M has, kinds of communications carried out via these input/output terminals, and signal change patterns in each kind of communication is called an interface specification description of the hardware module M.

The interface specification description is useful for the logic verification of a design. The interface specification description can clarify the specification concerning communication procedures, and can share and help the understanding of the specification among designers. A method of generating a logic verification checker and a test pattern from the interface specification description is disclosed in Non-Patent Literature 5 ("A proposal for transaction-level verification with Component Wrapper Language" by Koji Ara and Kei Suzuki, Design Automation and Test in Europe (DATE), 2003).

According to the conventional techniques described in the Non-Patent Literatures 1 to 5, however, description of input constraints that a computer can interpret is necessary for the formal verification and the constraint-based verification. Therefore, concerning a newly designed hardware module, an engineer who understands this hardware module manually describes the input constraint, which is troublesome.

Each time when the specification is changed or corrected, the engineer must manually describe the change or the correction, which is also troublesome. The dependence on the manual work by the engineer as described above takes time for the verification work and also for the design work.

The dependence on the manual work by the engineer may lead to a leakage or an error in the prepared description of input constraints. As a result, the logic verification cannot be carried out correctly, the precision of the logic verification is lowered, and the production yield is lowered.

SUMMARY OF THE INVENTION

It is an object of the present invention to solve at least the problems in the conventional technology.

The logic verification device according to an aspect of the present invention comprises an input unit that receives an input of hardware description information concerning a design content of a hardware module and interface specification description information concerning a communication procedure of the hardware module, and a logic verifying unit that carries out a logic verification of the operation of the hardware module based on the hardware description information and the interface specification description information input by the input unit.

The logic verification method according to another aspect of the present invention comprises an input step that receives an input of hardware description information concerning a design content of a hardware module and interface specification description information concerning a communication procedure of the hardware module, and a logic verifying step that carries out a logic verification of the operation of the hardware module based on the hardware description information and the interface specification description information input by the input step.

The logic verification program according to still another aspect of the present invention causes a computer to execute the above logic verification method.

The computer-readable recording medium according to still another aspect of the present invention stores therein the above computer program which causes a computer to execute the above logic verification method.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is an explanatory diagram of interface specification description information of a hardware module shown in FIG. 10;

FIG. 5 is a table of input/output constraint information, input constraint information, and output constraint information of each transition branch in the status transition graph shown in FIG. 4;

DETAILED DESCRIPTION

Figure 10:
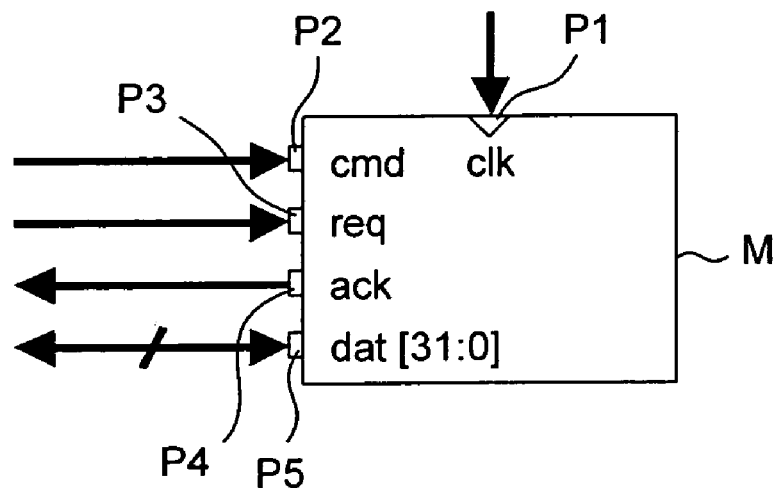
FIG. 10 is a block diagram of one example of a general hardware module of which logic is to be verified.
Figure 11:
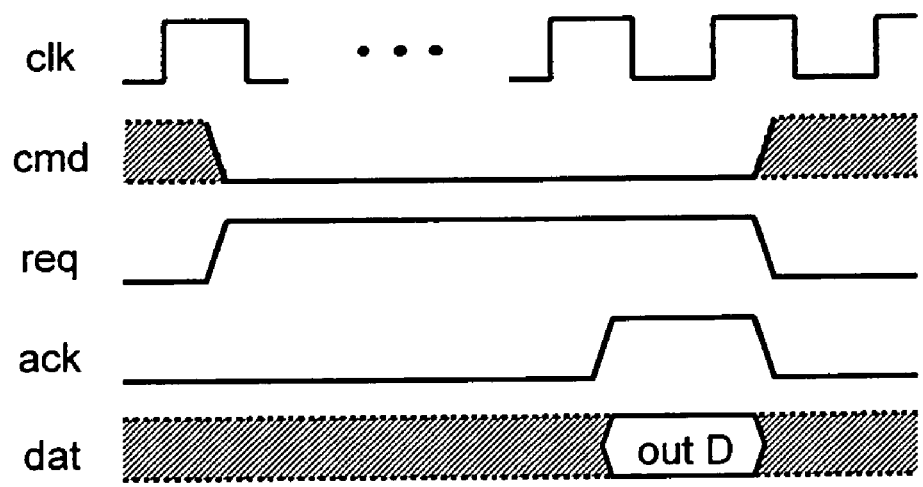
FIG. 11 is a waveform diagram of a read operation carried out by the hardware module.

Exemplary embodiments of a logic verification device, a logic verification method, a logic verification program, and a recording medium according to the present invention will be explained in detail below with reference to the accompanying drawings. In the embodiment of the present invention, the hardware module shown in FIG. 10 is explained as a hardware module of which logic is to be verified. The logic verification device and the logic verification method according to the embodiment can be realized with a CAD (computer-aided design) system that has a recording medium recorded with a logic verification program according to the embodiment.

Figure 1:
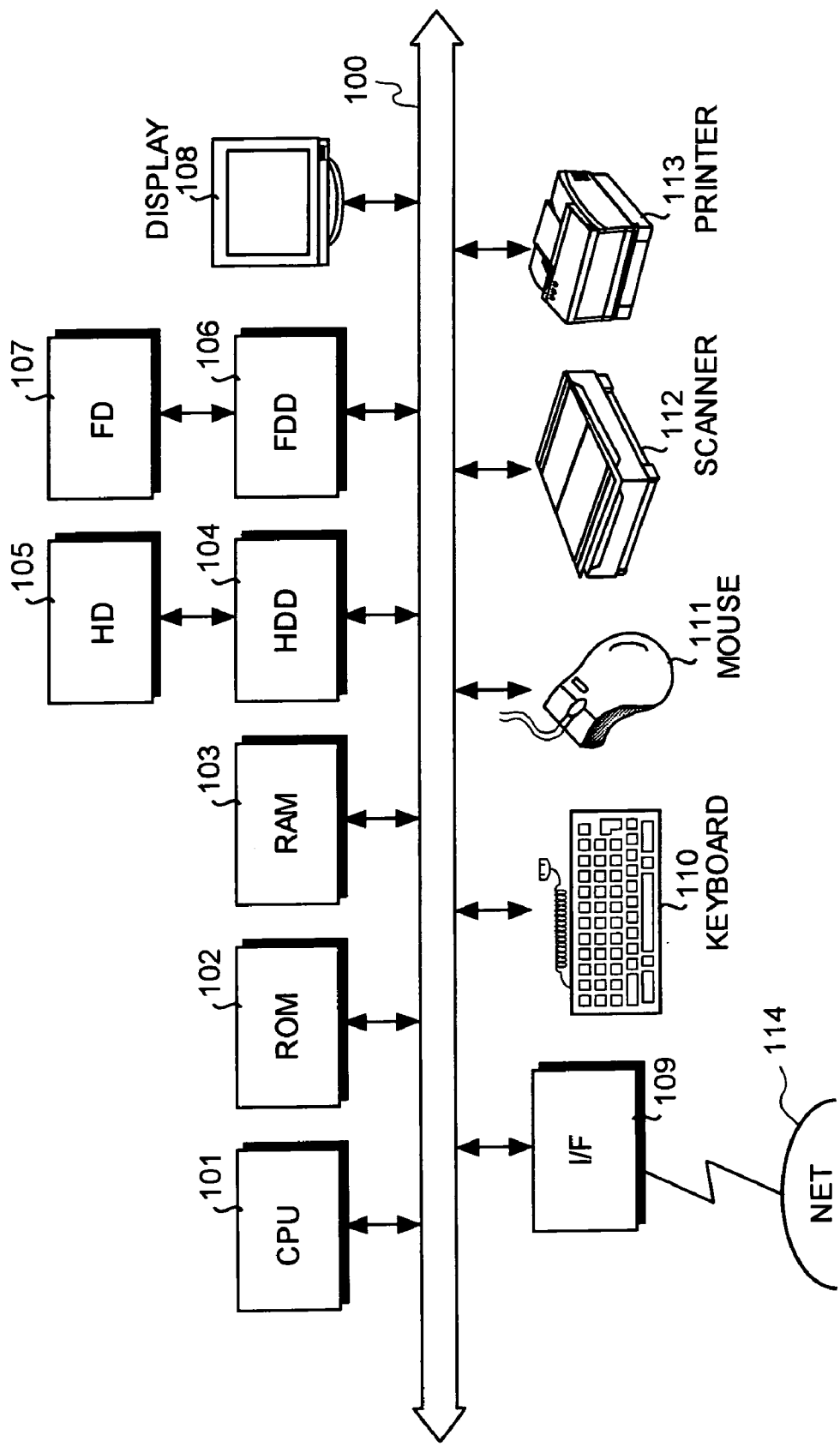
FIG. 1 is a block diagram of a hardware configuration of a logic verification device according to an embodiment of the present invention.

A hardware configuration of the logic verification device according to the embodiment of the present invention is explained first. FIG. 1 is a block diagram of the hardware configuration of the logic verification device according to the embodiment.

In FIG. 1, the logic verification device has a CPU (central processing unit) 101, a ROM (read-only memory) 102, a RAM (random access memory) 103, an HDD (hard disk drive) 104, an HD (hard disk) 105, an FDD (flexible disk drive) 106, an FD (flexible disk) 107 as one example of a detachable recording medium, a display 108, an I/F (interface) 109, a keyboard 110, a mouse 111, a scanner 112, and a printer 113. These constituent parts are connected via a bus 100.

The CPU 101 controls the entire logic verification device. The ROM 102 stores a program such as a boot program. The RAM 103 is used for a work area of the CPU 101. The HDD 104 controls reading and writing of data from and into the HD 105 according to the control from the CPU 101. The HD 105 stores data written based on the control from the HDD 104.

The FDD 106 controls reading and writing or data from and into the FD 107 according to the control from the CPU 101. The FD 107 stores data written based on the control from the FDD 106, and makes the logic verification device read data stored in the FD 107.

The detachable recording medium also includes a CD-ROM (compact disk read-only memory) (CD-R (compact disk recordable), CD-RW (compact disk rewritable)), an MO (magneto-optic disk), a DVD (digital versatile disk), and a memory card, in addition to the FD 107. The display 108 displays a cursor, an icon, a tool box, and data such as a document, an image, and functional information. A CRT (cathode ray tube), a TFT (thin-film transistor) liquid crystal display, and a plasma display can be employed for the display 108.

The I/F 109 is connected to a network 114 such as the Internet via a communication line, and is further connected to other devices via this network 114. The I/F 109 also interfaces between the network 114 and an internal unit, and controls input and output of data into and from an external device. A modem or a LAN (local area network) adaptor can be employed for the I/F 109.

The keyboard 110 has keys to input letters, numerals, and various instructions, and inputs data. The keyboard 110 can also have a touch-panel input pad, and ten-keys. The mouse 111 is used to move a cursor, select a range, and move a window and change the size of the window. A trackball and a joystick can be also used that has similar functions as a pointing device.

The scanner 112 optically reads an image, and fetches image data into the logic verification device. The scanner 112 can have an OCR (optical character recognition) function. The printer 113 prints image data and document data. A laser printer and an inkjet printer can be employed for the printer 113.

Figure 2:
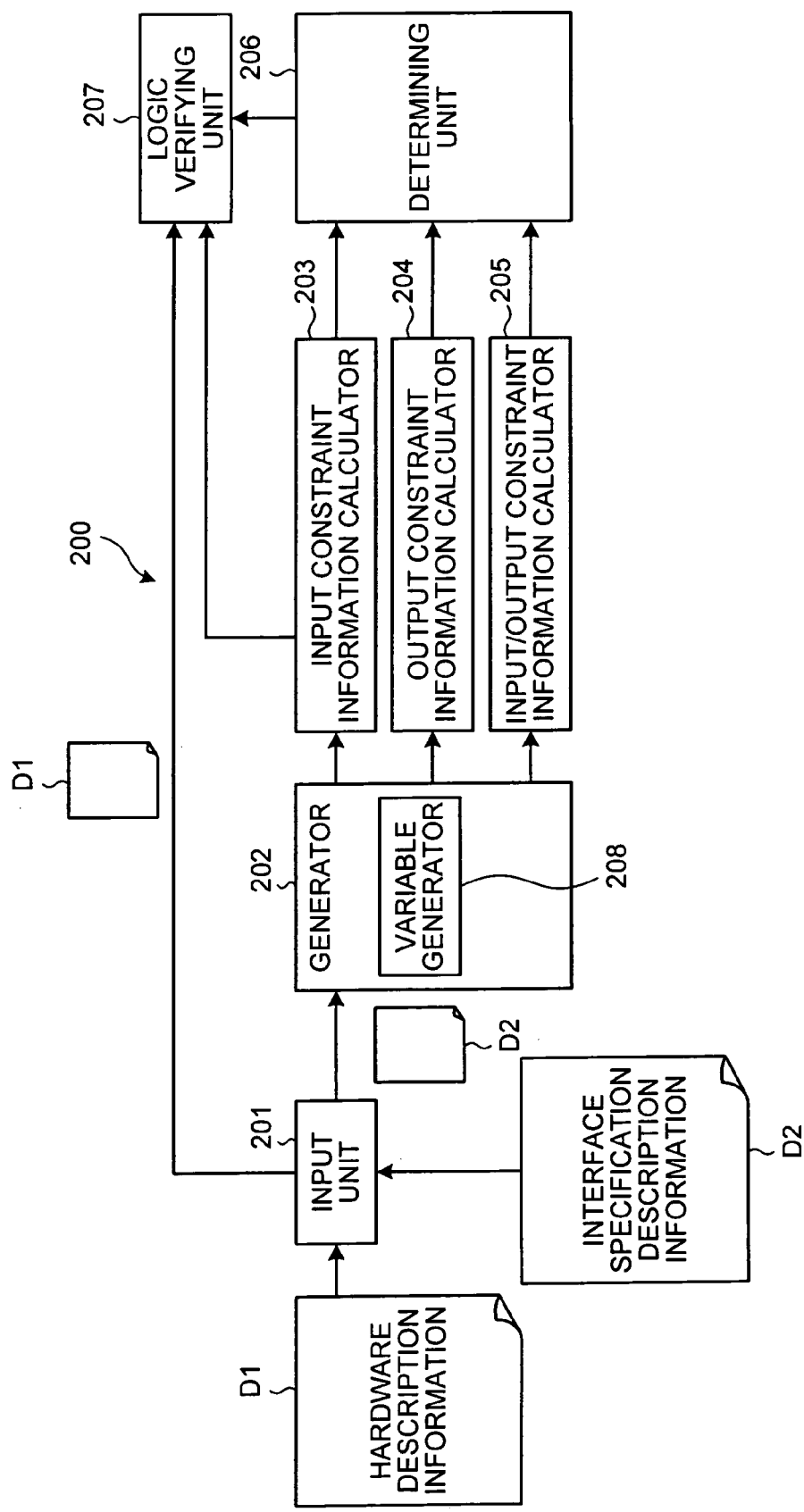
FIG. 2 is a block diagram of a functional configuration of the logic verification device according to the embodiment of the present invention.

A functional configuration of the logic verification device according to the embodiment of the present invention is explained next. FIG. 2 is a block diagram of the functional configuration of the logic verification device according to the embodiment of the present invention. In FIG. 2, a logic verification device 200 includes an input unit 201, a generator 202, an input constraint information calculator 203, an output constraint information calculator 204, an input/output constraint information calculator 205, a determining unit 206, and a logic verifying unit 207.

The input unit 201 receives hardware description information D1, and interface specification description information D2. The hardware description information D1 includes a description of the design content of the hardware module. Specifically, a hardware description language HDL such as Verilog is used to describe this information.

More specifically, the hardware description information D1 is described using abstract levels such as an operation level, an RTL (register transfer language) level, and a gate level. The logic verifying unit 207 uses this hardware description information D1 to carry out a normal verification of the logic of the hardware module.

On the other hand, the interface specification description information D2 describes a procedure of communications carried out by the hardware module. The interface specification description information D2 is an exhaustive description of input/output terminals that the hardware module has, kinds of communications carried out via these input/output terminals, and signal change patterns in each kind of communication.

Specifically, the interface specification description information D2 includes signal change patterns of signals that are input to and output from the terminals P1 to P5 of the hardware module M shown in FIG. 10, and signal direction information that indicates directions of the signals that are input to and output from the terminals P1 to P5 at respective times of the signal change patterns.

The interface specification description information D2 can be described using a text file on the computer, and is described in a description language in which a grammar and interpretation are mathematically defined. For example, a time change pattern of a signal value can be mathematically expressed based on a regular expression. The interface specification description information D2 of the hardware module M shown in FIG. 10 is explained below using a CWL (component wrapper language) as one of this type of languages.

FIG. 3 is an explanatory diagram of the interface specification description information D2 of the hardware module M shown in FIG. 10. In FIG. 3, three-digit number at the left side indicates row numbers. In the first row (001), there is described the name "M" of the hardware module of which interface is to be described.

In the second to the eighth rows (002 to 008), the five terminals P1 to P5 (physically 36 lines) of the hardware module M are described. Specifically, "clk" denotes the clock input terminal P1, "cmd" denotes the command input terminal P2, "req" denotes the request input terminal P3, "ack" denotes the acknowledge output terminal P4, and "dat" denotes the data input/output terminal P5 for 32-bit data. In the second to the eighth rows (002 to 008), "input", "output", and "inout" denote signal direction information indicating directions of signals.

In the ninth to the seventeenth rows (009 to 017), combinations of the signal values P1 to P5 at times when the clock signal clk changes are defined. For example, ¬cmd∧req∧¬ack (where "?" of the data signal dat means "optional") at the rise time of the clock signal clk in the eleventh row (011) is defined as "R". "¬" denotes NOT and "∧" denotes AND.

In the twelfth row (012), ¬cmd∧req∧ack∧(dat=D) at the rise time of the clock signal clk for the 32-bit parameter D is defined as "S(D)". The data signal dat of this S(D) is a data signal (outD) in the output direction. Thereafter, "W(D)", "K(D)", and "IDLE" are defined in a similar manner. In the ninth to the seventeenth rows (009 to 017), the "outD" and "inD" are signal direction information indicating directions of signals.

In the eighteenth to the twenty-first rows (018 to 021), two kinds of signal change patterns of "read" and "write" are defined. "+" is a symbol that indicates repetition of at least one time. A definition "R+S(D)" of the read pattern indicates that S(D) occurs after "R" is repeated by at least one time.

A definition "W(D)+K(D)" of the write pattern indicates that K(D) occurs after W(D) is repeated by at least one time. A value of the parameter D must be constant in the middle of the read pattern and the write pattern respectively. Therefore, in the write pattern, a constraint is expressed that a signal value of the data input/output terminal P5 has a constant value for the whole period via "D". In the read pattern, "D" appears at only the last time, and therefore, there is no constraint via "D".

In the twenty-second to the twenty-eighth rows (022 to 028), it is indicated that the read pattern and the write pattern occur in this interface, and the status at other times is IDLE without exception. The interface specification description information D2 can be in any other computer-processible format so long as the information contains a signal change pattern and signal direction information at the terminals P1 to P5. Other necessary interface specification description information (such as the waveform diagrams shown in FIG.

Figure 12:
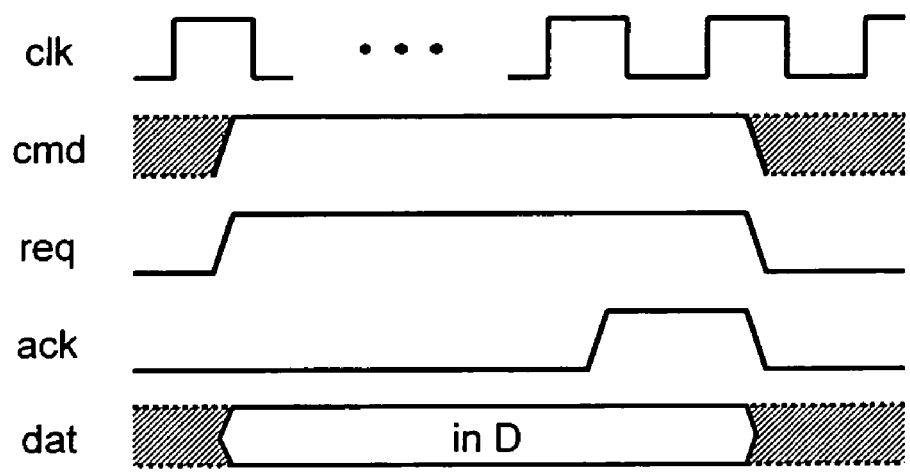
FIG. 12 is a waveform diagram of a write operation carried out by the hardware module.
Figure 13:
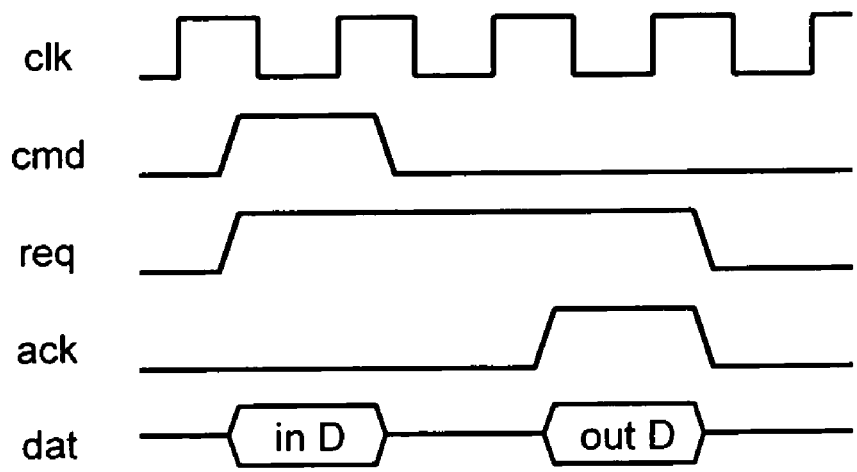
FIG. 13 is a waveform diagram of input constraints violated by the hardware module.

11 and FIG. 12) can be input according to GUI (graphical user interface) on the computer.

With reference to FIG. 2, the generator 202 generates a finite state machine model concerning a status transition of signals input to and output from the hardware module M, based on the interface specification description information D2 input by the input unit 201. The finite state machine model is an operation (dynamic) model described using a finite state aggregate or a finite transition aggregate from a certain status to other status that the hardware module M can take.

The generator 202 includes a variable generator 208. The variable generator 208 generates an input variable and an output variable obtained by adding signal direction information matching the direction of the signal to signal specifying information for specifying the signal to be input to and output from the hardware module M, based on the signal change pattern and the signal direction information.

The signal specifying information is a signal name such as "cmd" and "ack". Signal direction information that matches a direction of the signal name is added to the end of the signal name, thereby generating an input variable and an output variable. Specifically, when the signal name is "cmd", this indicates an input signal. Therefore, "_in" that indicates an input direction is added to the end of "cmd", thereby generating an input variable "cmd_in". Similarly, when the signal name is "ack", this indicates an output signal. Therefore, "_out" that indicates an output direction is added to the end of "ack", thereby generating an output variable "ack_out". When a finite state machine model is generated using the input variable and the output variable, the above signal direction information can described in the finite state machine model.

Figure 4:
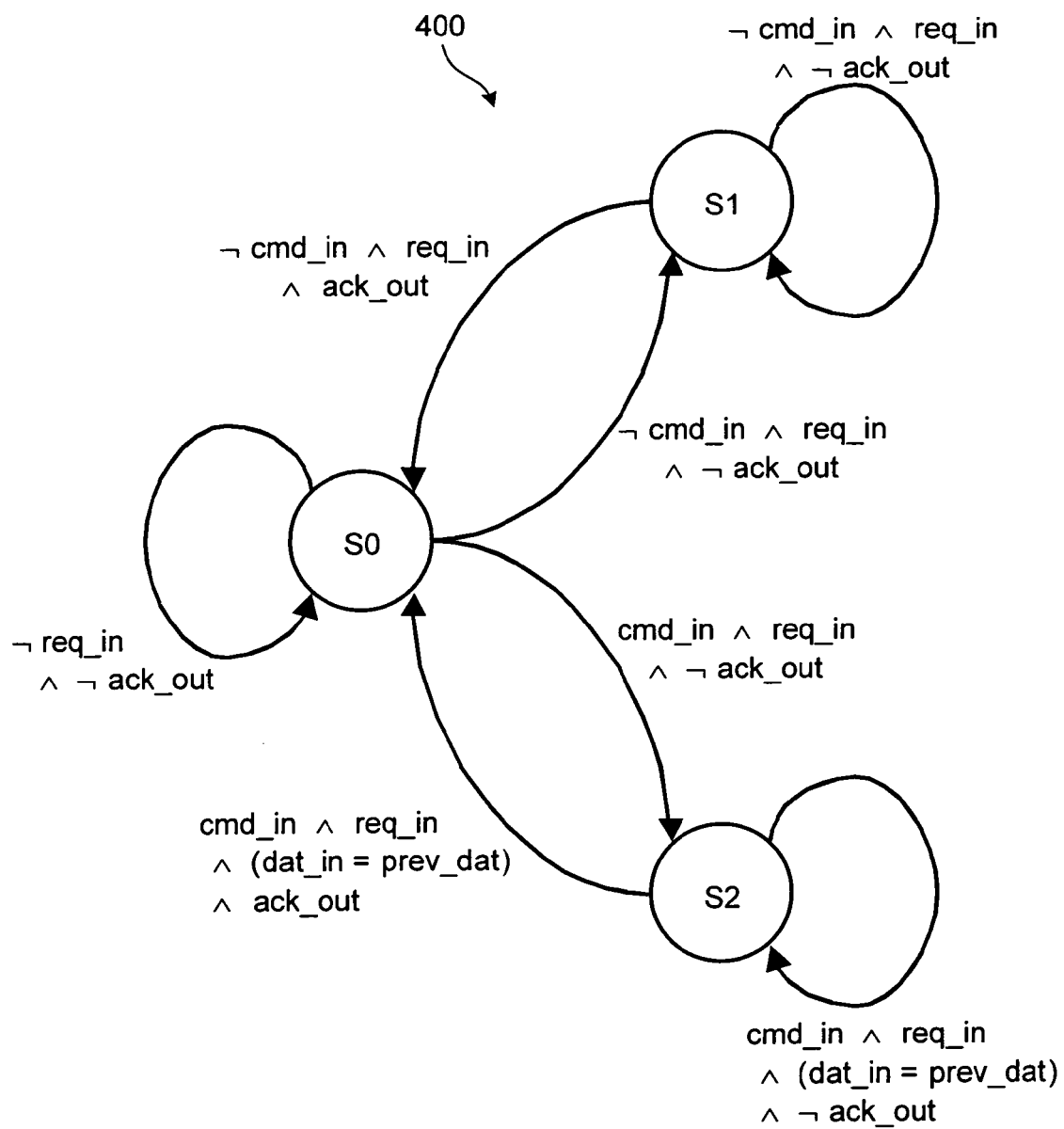
FIG. 4 is an explanatory diagram of a status transition graph.

The finite state machine model generated by the generator 202 can be expressed in a status transition graph using the input variable and the output variable. FIG. 4 is an explanatory diagram of the status transition graph. In a status transition graph 400, a logical function that prescribes a condition of a transition from a status of an optional transition origin to a status of an optional transition destination using an input variable and an output variable is related to each transition branch (S0→S0, S0→S1, S0→S2, S1→S0, S1→S1, S2→S0, and S2→S2). In FIG. 4, the transition status "S0" is the initial status, from which a status transition occurs at the rise timing of the clock signal clk.

A logical function expressing a transition condition is described in the transition branch. This logical function is described using the input variable and the output variable. Therefore, the logical function itself becomes the input/output constraint information of each transition branch concerning the constraint that the signal input to and output from the hardware module M must satisfy. "prev_dat" that is described in the logical function of the transition branch of the status "S2" denotes a 32-bit register that is added to the finite state machine model. This register holds the value of the data input/output terminal P5 at the previous time.

With reference to FIG. 2, the input constraint information calculator 203 calculates input constraint information concerning the constraint that the signal input to the hardware module M must satisfy, based on the interface specification description information D2 that is input by the input unit 201. Specifically, the input constraint information calculator 203 calculates the input constraint information using the finite state machine model generated by the generator 202. This input constraint information can be calculated by erasing the output variable from the finite state machine model generated by the generator 202.

On the other hand, the output constraint information calculator 204 calculates the output constraint information concerning the constraint that the signal output from the hardware module M must satisfy, by erasing the input variable from the finite state machine model. The erase processing of erasing the output variable and the input variable when the finite state machine model is expressed in the transition status graph 400 is explained below.

The input constraint information calculator 203 erases the output variable from the logical function that prescribes the transition condition in the status transition graph 400, using existential quantification. Based on this erasing, the input constraint information for the transition branch can be calculated. The input constraint information of each transition status (S0, S1, and S2) in the status transition graph 400 can be expressed as a logical sum of the input constraint information concerning all the transition branches.

On the other hand, the output constraint information calculator 204 erases the input variable from the logical function that prescribes the transition condition in the status transition graph 400, using existential quantification. Based on this erasing, the output constraint information for the transition branch can be calculated. The output constraint information of each transition status (S0, S1, and S2) in the status transition graph 400 can be expressed as a logical sum of the output constraint information concerning all the transition branches. This output constraint information can be used as verification property of logic verification.

The existential quantification is explained in detail below. Here, an optional logical function $f(x_1, \ldots, x_i, \ldots, $ and $x_n)$ is assumed. An existential quantifier ∃ calculation to erase the logical variable $x_i$ from the logical function $f(x_1, \ldots, x_i, \ldots, $ and $x_n)$ according to the existential quantification can be defined by the following expression (1).

$$\exists x_i.f(x_1, \ldots, x_i, \ldots, x_n) = f(x_1, \ldots, 0, \ldots, x_n) \lor f(x_1, \ldots, 1, \ldots, x_n) \quad (1)$$

More generally, when the variable $x_i$ is a multi-valued variable having an aggregate value V, the ∃ calculation can be defined by the following expression (2).

[Equation 1]

$$\exists x_i \cdot f(x_1, \ldots, x_i, \ldots, x_n) = \bigvee_{a \in V} f(x_1, \ldots, a, \ldots, x_n) \quad (2)$$

The ∃ calculation concerning a variable aggregate $(y_1, \ldots, y_m)$ can be obtained from the following expression (3).

$$\exists (y_1, \ldots, y_m).f = \exists y_1 \ldots \exists y_m.f \quad (3)$$

In the above ∃ $x_i$.f calculation of the expression (1), "a condition for remaining variables to enable the presence of allocation of a value to the variable $x_i$ to set the value of logic function f to 1" is accurately obtained. Therefore, to erase the output variable from the input/output constraint according to this method means to accurately obtain "a condition for the input variable to enable the presence of allocation of an output value that satisfies the input/output constraint", i.e., the input constraint.

A correct result cannot be obtained by simply erasing (disregarding) the logical variables (output variables and input variables) of the logical function. Assume that input/output constraints of input variables a and b and an output variable x are given by a logical expression Q of the following expression (4).

$$Q = (a \lor x) \neg \land (b \land x) \quad (4)$$

A correct input constraint C can be calculated according to the following expression (5) using the ∃ calculation.

$$C = \exists x \cdot Q \quad (5)$$
$$= \exists x \cdot \{(a \vee x) \wedge \neg (b \wedge x)\}$$
$$= \{(a \vee 0) \wedge \neg (b \wedge 0)\} \vee \{(a \vee 1) \wedge \neg (b \wedge 1)\}$$
$$= \{(a) \wedge \neg (0)\} \vee \{(1) \wedge \neg (b)\}$$
$$= \{a \wedge 1\} \vee \{1 \wedge \neg b\}$$
$$= a \vee \neg b$$

On the other hand, when the calculation of the output variable x is simply removed from the expression Q, a different result of $C'=a \wedge \neg b$ is obtained. Regarding the logical function processing including the $\exists$ calculation on the computer, an efficient algorithm using a binary decision diagram (BDD) is widely known.

Figures 6, 7:
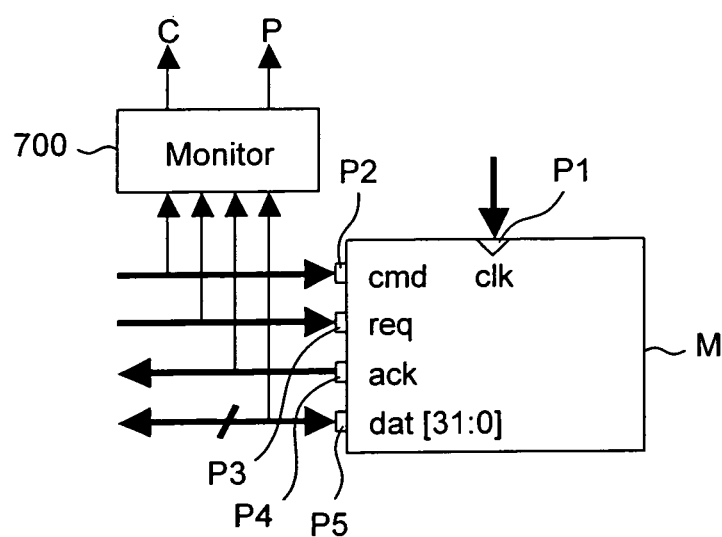
FIG. 6 is a table of input constraint information and output constraint information of each transition status based on the table shown in FIG. 5.
FIG. 7 is a configuration diagram of a combined system of a hardware module and a monitoring circuit.

FIG. 5 is a table of the input/output constraint information, the input constraint information, and the output constraint information in the status transition graph 400 shown in FIG. 4. Specifically, FIG. 5 is a table of the input/output constraint information, the input constraint information, and the output constraint information of each transition branch in the status transition graph 400 shown in FIG. 4. FIG. 6 is a table of the input constraint information and the output constraint information of each transition status based on the table shown in FIG. 5.

In FIG. 5, when the transition condition is the transition branch S0→S1, that is, when the input/output constraint information is $Q_{01}$, input/output constraint information $Q_{01}$, and corresponding input constraint information $C_{01}$ and output constraint information $P_{01}$ are obtained from the following expressions (6) to (8) respectively.

$$Q_{01} = \neg \text{cmd\_in} \wedge \text{reg\_in} \wedge \neg \text{ack\_out} \quad (6)$$

$$C_{01} = \exists \text{ack\_out} \cdot Q_{01} \quad (7)$$
$$= \exists \text{ack\_out} \cdot (\neg \text{cmd\_in} \wedge \text{req\_in} \wedge \neg \text{ack\_out})$$
$$= (\neg \text{cmd\_in} \wedge \text{req\_in} \wedge \neg 0) \vee (\neg \text{cmd\_in} \wedge \text{req\_in} \wedge \neg 1)$$
$$= \neg \text{cmd\_in} \wedge \text{req\_in}$$

$$P_{01} = \exists (\text{cmd\_in, req\_in}) \cdot Q_{01} \quad (8)$$
$$= \exists (\text{cmd\_in, req\_in}) \cdot (\neg \text{cmd\_in} \wedge \text{req\_in} \wedge \neg \text{ack\_out})$$
$$= \exists \text{cmd\_in} \cdot \left\{ \begin{array}{l} (\neg \text{cmd\_in} \wedge 0 \wedge \neg \text{ack\_out}) \vee \\ (\neg \text{cmd\_in} \wedge 1 \wedge \neg \text{ack\_out}) \end{array} \right\}$$
$$= \exists \text{cmd\_in} \cdot (\neg \text{cmd\_in} \wedge \neg \text{ack\_out})$$
$$= (\neg 0 \wedge \neg \text{ack\_out}) \vee (\neg 1 \wedge \neg \text{ack\_out})$$
$$= \neg \text{ack\_out}$$

In FIG. 6, input constraint information $C_0$ and output constraint information $P_0$ corresponding to the transition status S0 are obtained from the following expressions (9) and (10) respectively.

$$C_0 = C_{00} \vee C_{01} C_{02} \quad (9)$$
$$= (\neg \text{req\_in}) \vee (\neg \text{cmd\_in} \wedge \text{req\_in}) \vee (\text{cmd\_in} \wedge \text{req\_in})$$
$$= 1$$

$$P_0 = P_{00} \vee P_{01} \vee P_{02} \quad (10)$$
$$= (\neg \text{ack\_out}) \vee (\neg \text{ack\_out}) \vee (\neg \text{ack\_out})$$
$$= \neg \text{ack\_out}$$

When a variable that expresses the current status (status of the transition origin in the status transition graph 400) of the finite state machine model is "s", the total input constraint information C and the total output constraint information P can be expressed by the following expressions (11) and (12) respectively.

$$C = \{(s = S0) \wedge C_0\} \vee \{(s = S1) \wedge C_1\} \vee \{(s = S2) \wedge C_2\} \quad (11)$$
$$= (s = S0) \vee (s = S1) \wedge \neg \text{cmd\_in} \wedge \text{req\_in} \vee$$
$$\{(s = S2) \wedge \text{cmd\_in} \wedge \text{req\_in} \wedge (\text{dat\_in} = \text{prev\_dat})\}$$

$$P = \{(s = S0) \wedge P_0\} \vee \{(s = S1) \wedge P_1\} \vee \{(s = S2) \wedge P_2\} \quad (12)$$
$$= \{(s = S0) \wedge \neg \text{ack\_out}\} \vee (s = S1) \vee (s = S2)$$

Alternatively, the input constraint information (or the output constraint information) of each transition status can be obtained, by first obtaining the input/output constraint information of each transition status using a logical sum of the input/output constraint information of all the transition branches obtained from the transition statuses and then respectively erasing the output variables (or the input variables. Alternatively, the total input constraint information (or the total output constraint information) can be obtained, by first obtaining the total input/output constraint information and then erasing the output variables (or the input variables).

The finite state machine model generated by the generator 202 shown in FIG. 2 can be also expressed using a stratus transition relational expression that expresses the status transition relation. The status transition relational expression is a logical function that prescribes a condition of a transition from a status of an optional transition origin to a status of an optional transition destination using an input variable and an output variable. Further, in this status transition relational expression, a status transition relation is prescribed using the input variable and the output variable that prescribe the transition condition, a current status variable concerning the status of the transition origin, and the next status variable concerning the status of the transition destination.

In other words, the status transition relational expression is a logical function including the variable that expresses the current status of the finite state machine model (current status variable), the variable that expresses the status of the next time (next status variable), and the variables that express the input/output values of the hardware module M (input variable and the output variable). The condition for making the logical value "1" is set equivalent to the condition for status transition.

The input/output constraint information calculator 205 shown in FIG. 2 erases the next status variable from the status transition relational expression (logical function), thereby calculating the input/output constraint information. The input constraint information calculator 203 erases the output variable from the calculated input/output constraint information, thereby calculating the input constraint information. The output constraint information calculator 204 erases the input variable from the calculated input/output constraint information, thereby obtaining the output constraint information.

The status transition relation corresponding to the hardware module M can be expressed by a logical function R of the following expression (13) using the next status variable as t.

$$R = \{(s = S0) \land \neg \text{req\_in} \land \neg \text{ack\_out} \land (t = S0)\} \quad (13)$$
$$\lor \{(s = S0) \land \neg \text{cmd\_in} \land \text{req\_in} \land \neg \text{ack\_out} \land (t = S1)\}$$
$$\lor \{(s = S1) \land \neg \text{cmd\_in} \land \text{req\_in} \land \text{ack\_out} \land (t = S0)\}$$
$$\lor \{(s = S1) \land \neg \text{cmd\_in} \land \text{req\_in} \land \neg \text{ack\_out} \land (t = S1)\}$$
$$\lor \{(s = S0) \land \text{cmd\_in} \land \text{req\_in} \land \neg \text{ack\_out} \land (t = S2)\}$$
$$\lor \{(s = S2) \land \text{cmd\_in} \land \text{req\_in} \land$$
$$(\text{dat\_in} = \text{prev\_dat}) \land \text{ack\_out} \land (t = S0)\}$$
$$\lor \{(s = S2) \land \text{cmd\_in} \land \text{req\_in} \land (\text{dat\_in} = \text{prev\_dat}) \land$$
$$\neg \text{ack\_out} \land (t = S2)\}$$

The input/output constraint information Q, the input constraint information C, and the output constraint information P can be obtained by the following expressions (14) to (16) respectively, using the logical function R.

$$Q = \exists t \cdot R \quad (14)$$
$$= \{(s = S0) \land \neg \text{req\_in} \land \neg \text{ack\_out}\}$$
$$\lor \{(s = S0) \land \neg \text{cmd\_in} \land \text{req\_in} \land \neg \text{ack\_out}\}$$
$$\lor \{(s = S1) \land \neg \text{cmd\_in} \land \text{req\_in} \land \text{ack\_out}\}$$
$$\lor \{(s = S1) \land \neg \text{cmd\_in} \land \text{req\_in} \land \neg \text{ack\_out}\}$$
$$\lor \{(s = S0) \land \text{cmd\_in} \land \text{req\_in} \land \neg \text{ack\_out}\}$$
$$\lor \{(s = S2) \land \text{cmd\_in} \land \text{req\_in} \land (\text{dat\_in} = \text{prev\_dat}) \land \text{ack\_out}\}$$
$$\lor \{(s = S2) \land \text{cmd\_in} \land \text{req\_in} \land (\text{dat\_in} = \text{prev\_dat}) \land \neg \text{ack\_out}\}$$
$$= \{(s = S0) \land \neg \text{ack\_out}\} \lor \{(s = S1) \land \neg \text{cmd\_in} \land \text{req\_in}\}$$
$$\lor \{(s = S2) \land \text{cmd\_in} \land \text{req\_in} \land (\text{dat\_in} = \text{prev\_dat})\}$$

$$C = \exists \text{ack\_out} \cdot Q \quad (15)$$
$$= (s = S0) \lor \{(s = S1) \land \neg \text{cmd\_in} \land \text{req\_in}\}$$
$$\lor \{(s = S2) \land \text{cmd\_in} \land \text{req\_in} \land (\text{dat\_in} = \text{prev\_dat})\}$$

$$P = \exists (\text{cmd\_in, req\_in, dat\_in}) \cdot Q \quad (16)$$
$$= \{(s = S0) \land \neg \text{ack\_out}\} \lor (s = S1) \lor (s = S2)$$

With reference to FIG. 2, the determining unit 206 determines validity of the interface specification description information D2 based on the input constraint information calculated by the input constraint information calculator 203 and the output constraint information calculated by the output constraint information calculator 204. The validity of the interface specification description information D2 can be confirmed by determining whether the logical product of the input constraint information and the output constraint information coincides with the logical function that prescribes the transition condition.

For example, when the finite state machine model generated by the generator 202 is the status transition graph 400 shown in FIG. 4, the input constraint information calculator 203 erases the output variable from the logical function of the status transition graph 400 using the existential quantification, thereby calculating the input constraint information. The output constraint information calculator 204 erases the input variable from the logical function of the status transition graph 400 using the existential quantification, thereby calculating the output constraint information.

The determining unit 206 determines whether the logical product of the input constraint information and the output constraint information coincides with the logical function that prescribes the transition condition. For example, in the above expressions (6) to (8), the determining unit 206 determines whether the logical product $C_{01} \land P_{01}$ of the input constraint information $C_{01}$ and the output constraint information $P_{01}$ coincides with the logical function (input/output constraint information) $Q_{01}$. When they coincide, the interface specification description information D2 has no error. When they do not coincide, there is a possibility that the interface specification description information D2 has an error.

When the finite state machine model generated by the generator 202 is the logical function (status transition relational expression) R shown by the expression (13), the input/output constraint information calculator 205 erases the next status variable from the logical function R using the existential quantification, thereby calculating the input/output constraint information Q shown in the expression (14).

The input constraint information calculator 203 erases the output variable and the next status variable from the input/output constraint information Q using the existential quantification, thereby calculating the input constraint information C shown in the expression (15). Similarly, the output constraint information calculator 204 erases the input variable and the next status variable from the input/output constraint information Q using the existential quantification, thereby calculating the output constraint information P shown in the expression (16).

The determining unit 206 determines whether the logical product $C \land P$ of the input constraint information C and the output constraint information P coincides with the input/output constraint information Q. When they coincide, the interface specification description information D2 has no error. When they do not coincide, there is a possibility that the interface specification description information D2 has an error.

According to a design of the hardware module M of a normal synchronous sequence circuit, the logical product of the input constraint information and the output constraint information coincides with the original input/output constraint information in principle. When the logical product does not coincide with the original input/output constraint information, this indicates that the input constraint information and the output constraint information are not independent.

In other words, the interface specification description information D2 is described such that the hardware module M must change the output of the current time according to the input of the current time or must change the input of the current time according to the output of the current time. This situation indicates that there is an error in the interface specification description information D2 or the hardware module M is specially designed for the synchronous sequence circuit, which requires attention.

For example, when input/output constraint information of $(x \land y) \lor (\neg x \land \neg y)$ is available for the input variable x and the output variable y, the input constraint information and the output constraint information are "1" (no constraint), and their logical product does not coincide with the input/output constraint information. On the other hand, in the instance of the interface specification description information D2 of the hardware module M, the logical products of the input constraint information and the output constraint information all coincide with the input/output constraint information, which indicates that the interface specification description information D2 has no problem (defectiveness).

With reference to FIG. 2, the logic verifying unit 207 carries out the logic verification of the operation of the hardware module M based on the hardware description information D1 and the interface specification description information D2 input by the input unit 201. Specifically, the logic verifying unit 207 carries out the logic verification of the operation of the hardware module M by using the input constraint information calculated by the input constraint information calculator 203. For example, the logic verifying unit 207 checks presence or absence of bugs and generates an error pattern for debugging.

In other words, the logic verifying unit 207 confirms that the hardware module M operates correctly even when the value of a signal input to the input terminal of the hardware module M changes within a range of the value that satisfies the input constraint information, by using the input constraint information. Operation to the input that does not satisfy the input constraint violates the input constraint, and therefore, the content of the hardware description information or the interface specification description information D2 must be changed.

The input unit 201, the generator 202, the input constraint information calculator 203, the output constraint information calculator 204, the input/output constraint information calculator 205, the determining unit 206, the logic verifying unit 207, and the variable generator 208 implement their functions through the CPU 101 or the I/F 109. In other words, the CPU 101 executes the programs recorded on the ROM 102, the RAM 103, the HD 105, and the FD 107.

A system in which the hardware module M and a monitoring circuit are combined is explained next. FIG. 7 is a configuration diagram of a combined system of the hardware module M and a monitoring circuit 700. In FIG. 7, when the finite state machine model obtained from the interface specification description information D2 is combined with the input constraint information C and the output constraint information P, the hardware description information of the monitoring circuit 700 that monitors input/output of the hardware module M can be constructed.

When the hardware description information D1 of the hardware module M is combined with the hardware description information of the monitoring circuit 700, a logic verification environment can be constructed. The content to be verified is a property "when the input constraint information C continues to be effective from the initial status, the output constraint information P also continues to be effective". This property can be verified based on the conventional formal verification or the constraint-based verification.

Figure 8:
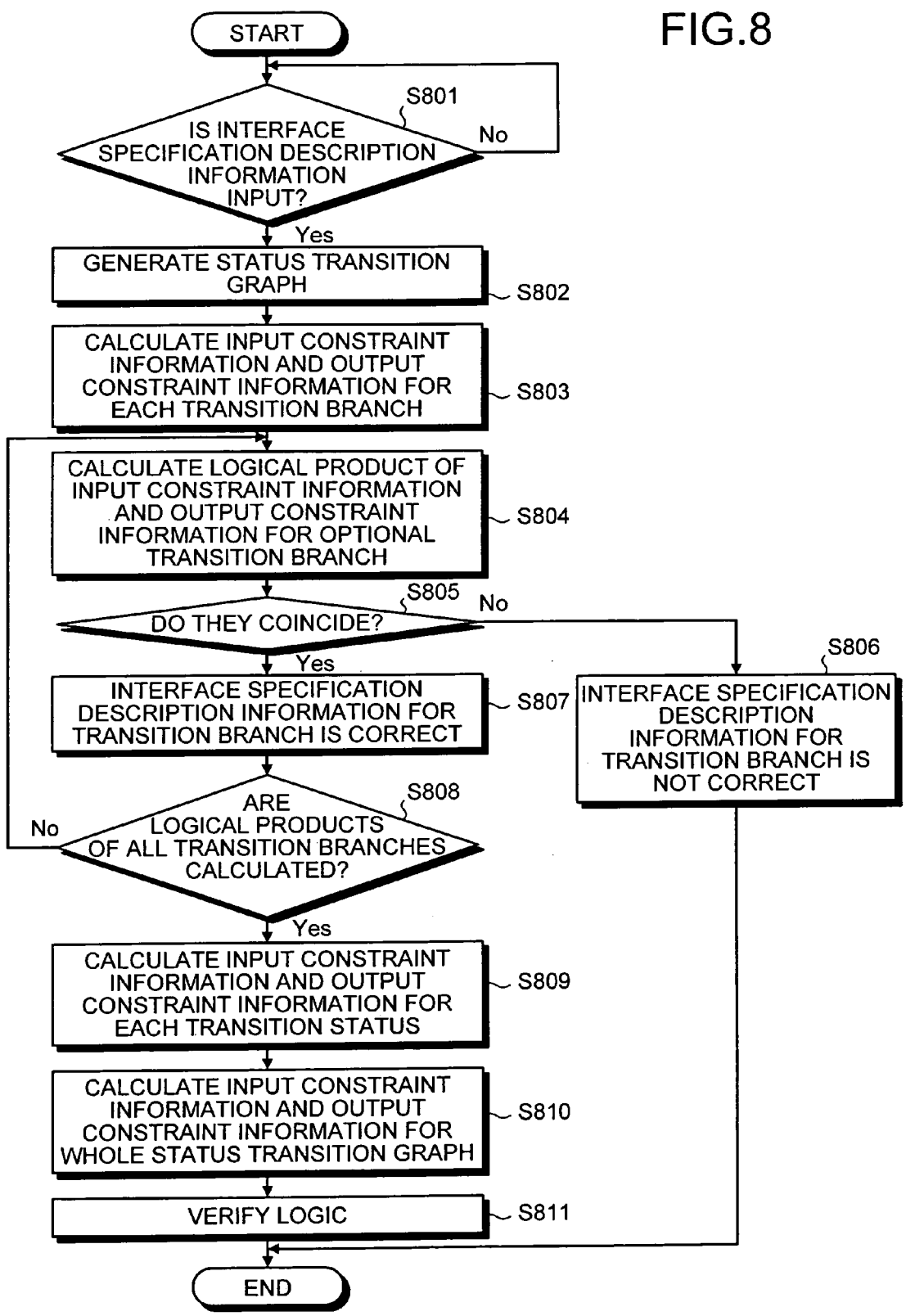
FIG. 8 is a flowchart of one example of a logic verification processing procedure according to the embodiment of the present invention.

One example of a logic verification processing procedure according to the embodiment of the present invention is explained next. FIG. 8 is a flowchart of one example of a logic verification processing procedure according to the embodiment of the present invention. This flowchart explains a processing procedure of expressing the finite state machine model in the status transition graph 400 shown in FIG. 4.

With reference to FIG. 8, when the interface specification description information D2 is input (Yes at step S801), the status transition graph 400 is generated from the interface specification description information D2 (step S802). Specifically, the status transition graph 400 shown in FIG. 4 is generated from the interface specification description information D2 shown in FIG. 3.

The input constraint information and the output constraint information are calculated for each transition branch of the status transition graph 400, using the status transition graph 400 (step S803). Taking an example of the transition condition of the transition branch S0→S1 shown in FIG. 5, the above expressions (6) to (8) are used to calculate the transition condition of the transition branch S0→S1, that is, the input/output constraint information $Q_{01}$, and the corresponding input constraint information $C_{01}$ and the output constraint information $P_{01}$.

A logical product of the input constraint information and the output constraint information of a calculated optional transition branch is calculated (step S804). In the above example, a logical product $C_{01} \wedge P_{01}$ of the input constraint information $C_{01}$ and the output constraint information $P_{01}$ is calculated.

It is determined whether the calculated logical product coincides with the input/output constraint information that becomes the transition condition (step S805). In the above example, it is determined whether the logical product $C_{01} \wedge P_{01}$ of the input constraint information $C_{01}$ and the output constraint information $P_{01}$ coincides with the input/output constraint information $Q_{01}$ that becomes the transition condition of the transition branch S0→S1.

When the logical product does not coincide with the input/output constraint information that becomes the transition condition (No at step S805), it is determined that the interface specification description information D2 of the transition branch is not correct (step S806), and the series of processing ends. In other words, this indicates that either the interface specification description information D2 has an error or the hardware module (synchronous sequence circuit) M is specially designed, which requires attention.

As described above, the processing ends when the determination of disagreement is made for any one transition branch. Therefore, defectiveness of the interface specification description information D2 can be detected before determining about coincidence of transition conditions for all the transition branches ends (step S805).

As a result, validity confirmation of the interface specification description information D2 can be carried out fast. Since defectiveness of the interface specification description information D2 can be detected before the logic verification (step S811), retroactive logic verification can be prevented, which can shorten the logic verification period.

On the other hand, at step S805, when the logical product coincides with the input/output constraint information that becomes the transition condition (Yes at step S805), it is determined that the interface specification description information D2 of the transition branch is correct (step S807).

It is determined whether logical products for all transition branches are calculated (step S808). When logical products for all transition branches are not calculated (No at step S808), the process proceeds to step S804. On the other hand, when logical products for all transition branches are calculated (Yes at step S808), the input constraint information and the output constraint information are calculated for each transition status (step S809).

In the above example, the input constraint information $C_{01}$ and the output constraint information $P_{01}$ corresponding to the transition status S0 are calculated using the input constraint information $C_{01}$ and the output constraint information $P_{01}$ based on the expressions (9) and (10) respectively.

All the input constraint information and all the output constraint information of the status transition graph 400 are calculated (step S810). In the above example, the total input constraint information C and the total output constraint information P are calculated using the input constraint information $C_0$ and the output constraint information $P_0$, by setting "s" for the variable that expresses the current status in the finite state machine model, according to the expressions (11) and (12).

The logic verification of the operation of the hardware module M is carried out using the hardware description information D1 and the obtained input constraint information (step S811). In this logic verification work, the logic verification can be carried out using the correct interface specification description information D2 having no error. Therefore, precision and reliability of the logic verification can be improved.

Figure 9:
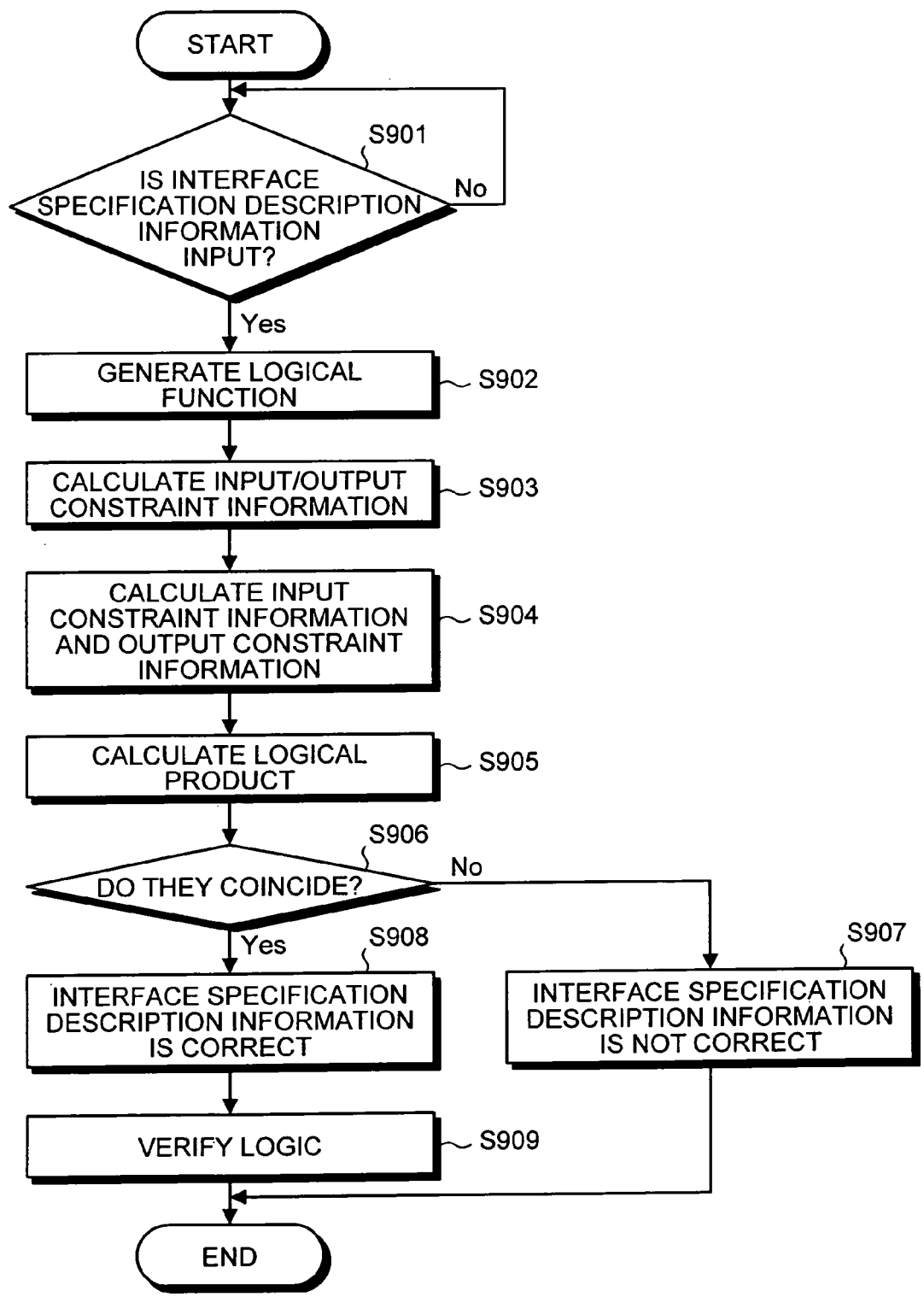
FIG. 9 is a flowchart of another example of the logic verification processing procedure according to the embodiment of the present invention.

Another example of a logic verification processing procedure according to the embodiment of the present invention is explained next. FIG. 9 is a flowchart of another example of the logic verification processing procedure according to the embodiment of the present invention. This flowchart is a logic verification processing procedure of expressing the finite state machine model in the logic function shown in the expression (13).

With reference to FIG. 9, when the interface specification description information D2 is input (Yes at step S901), the logic function is generated from the interface specification description information D2 (step S902). Specifically, the logic function R shown in the expression (13) is generated from the interface specification description information D2 shown in FIG. 3.

The input/output constraint information is calculated next using the generated logical function (step S903). In the above example, the input/output constraint information Q is calculated using the logical function R, based on the expression (14). The input constraint information and the output constraint information are calculated from the calculated input/output constraint information (step S904).

In the above example, the output variable and the next status variable are erased from the input/output constraint information Q using the existential quantification, thereby calculating the input constraint information C shown in the expression (15). Similarly, the input variable and the next status variable are erased from the input/output constraint information Q using the existential quantification, thereby calculating the output constraint information P shown in the expression (16).

A logical product of the input constraint information and the output constraint information is then calculated (step S905). In the above example, the logical product C∧P of the input constraint information C calculated based on the expression (15) and the output constraint information P calculated based on the expression (16) is calculated.

It is determined whether the calculated logical product coincides with the input/output constraint information calculated at step S903 (step S906). In the above example, it is determined whether the logical product C∧P of the input constraint information C and the output constraint information P coincides with the input/output constraint information Q.

When the logical product does not coincide with the input/output constraint information calculated at step S903 (No at step S906), it is determined that the interface specification description information D2 is not correct (step S907), and the series of processing ends. In other words, this indicates that either the interface specification description information D2 has an error or the hardware module (synchronous sequence circuit) M has a special design, which requires attention.

On the other hand, when the logical product coincides with the input/output constraint information calculated at step S903 (Yes at step S906), it is determined that the interface specification description information D2 is correct (step S908), in which case, the interface specification description information D2 has no error.

The logic verification of the operation of the hardware module M is carried out using the hardware description information D1 and the interface specification description information D2 which is determined to be correct at step S908 (step S909). In this logic verification work, the logic verification can be carried out using the correct interface specification description information D2 having no error. Therefore, precision and reliability of the logic verification can be improved.

As described above, according to the logic verification device 200, the logic verification method, the logic verification program, and the recording medium of the embodiment of the present invention, input constraint information can be calculated automatically without any manual work. Therefore, there is an effect that the logic verification work can be reduced, the logic verification period can be shortened, and the design period can be shortened.

Even when the content of the interface specification description information D2 must be changed or corrected, the input constraint information can be calculated automatically by simply inputting the changed or corrected interface specification description information. Therefore, there is an effect that the verification work efficiency can be improved without depending on the manual work of an engineer.

Particularly, since the input constraint information does not depend on the manual work of an engineer, there is an effect that the prepared input constraint information has no leakage or error, and logic verification can be carried out in high precision, with improved reliability of the operation of the hardware module M.

The logic verification method according to the embodiment can be realized by executing a program prepared in advance, with a computer such as a personal computer, a workstation, or a CAD. This program is recorded onto a computer-readable recording medium such as a hard disk, a flexible disk, a CD-ROM, an MO, and a DVD. The computer reads the program from the recording medium, and executes this program. This program can be a transmission medium that can be distributed via a network such as the Internet.

According to the present invention, the logic verification device, the logic verification method, the logic verification program, and the recording medium can shorten the logic verification period by carrying out high-precision logic verification in simple and efficient logic verification work.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A logic verification device comprising:
   an input unit that receives an input of hardware description information concerning a design content of a hardware module and interface specification description information concerning a communication procedure of the hardware module;

a logic verifying unit that carries out a logic verification of the operation of the hardware module based on the hardware description information and the interface specification description information input by the input unit;

an input constraint information calculator that calculates input constraint information concerning a donstraint that a signal input to the hardware module must satisfy, based on the interface specification description information input by the input unit; and the logic verifying unit canies out a logic verification of the operation of the hardware module based on the input constraint information calculated by the input constraint information calculator.

2. The logic verification device according to claim 1, further comprising:

a generator that generates a finite state machine model concerning a status transition of signals input to and output from the hardware module, based on the interface specification description information input by the input unit; and the input constraint information calculator calculates the input constraint information using the finite state machine model generated by the generator.

3. The logic verification device according to claim 2, wherein:

the interface specification description information contains a signal change pattern of signals input to and output from a terminal of the hardware module, and signal direction information indicating a direction of signals input to and output from the terminal at each time of the signal change; and the generator includes a variable generator that generates an input variable and an output variable obtained by adding the signal direction information that matches a direction of the signal to signal specifying information for specifying signals input to and output from the hardware module, based on the signal change pattern and the signal direction information, and generates the finite state machine model, using the input variable and the output variable generated by the variable generator.

4. The logic verification device according to claim 3, wherein:

the input constraint information calculator calculates the input constraint information by erasing the output variable from the finite state machine model generated by the generator.

5. The logic verification device according to claim 4, further comprising:

an output constraint information calculator that calculates output constraint information concerning a constraint that a signal output from the hardware module must satisfy by erasing the input variable from the finite state machine model generated by the generator;

a determining unit that determines validity of the interface specification description information based on the input constraint information calculated by the input constraint information calculator and the output constraint information calculated by the output constraint information calculated; and the logic verifying unit carries out a logic verification of the operation of the hardware module based on a result of a determination made by the determining unit.

6. The logic verification device according to claim 5, wherein;

the finite state machine model is expressed in a status transition graph in which a logical function is related to each transition branch, the logical function prescribing a condition of a transition from a status of an optional transition origin to a status of an optional transition destination with respect to the transition origin using the input variable and the output variable;

the input constraint information calculator calculates the input constraint information by erasing the output variable from the logical function of the status transition graph, using existential quantification; and the output constraint information calcutator calculates the output constraint information by erasing the input variable from the logical function of the status transition graph, using existential quantification; and the determining unit determines whether a logical product of the input constraint information and the output constraint information coincides with the logical function that prescribes the transition condition.

7. The logic verification device according to claim 5, wherein:

the finite state machine model is a logical function that prescribes a condition of a transition from a status of an optional transition origin to a status of an optional transition destination with respect to the transition origin using the input variable and The output variable, and prescribes a status transition relation using the input variable and the output variable that prescribe the transition condition, a current status variable concerning the status of the transition origin, and a next status variable concerning the status of the transition destination, and includes an input/output constraint information calculator that calculates input/output constraint information concerning a constraint that signals input to and output from the hardware module must satisfy by erasing the next status variable from the logical function, using existential quantification, wherein:

the input constraint information calculator calculates the input constraint information by erasing the output variable and the next status variable from the input/output constraint information calculated by The input/output constraint information calculator, using existential quantification;

the output constraint information calculator calculates the output constraint information by erasing the input variable and the next status variable from the input/output constraint information, using the existential quantification: and the determining unit determines whether a logical product of the input constraint information and the output constraint information coincides with the input/output constraint information.

8. The logic verification device according to claim 4, wherein:

the finite state machine model is expressed in a status transition graph in which a logical function is related to each transition branch, the logical function prescribing a condition of a transition from a status of an optional transition origin to a status of an optional transition destination with respect to the transition origin using the input variable and the output variabler; and the input constraint information calculator calculates the input constraint information by erasing the output variable from the logical function that prescribes the transition condition in the status transition graph, using existential quantification.

9. The logic verification device according to claim 4, wherein:

the finite state machine model is a logical function that prescribes a condition of a transition from a status of an optional transition origin to a status of an optional transition destination with respect to the transition origin using the input variable and the output variable, and prescribes a status transition relation using the input variable and the output variable that prescribe the transition condition, a current status variable concerning the status of the transition origin, and a next status variable concerning the status of the transition destination, and includes an input/output constraint information calculator that calculates input/output constraint information concerning a constraint that signals input to and output from the hardware module must satisfy, by erasing the next status variable from the logical function, using existential quantification; and the input constraint information calculator calculates the input constraint information by erasing the output variable and the next status variable from the input/output constraint information calculated by the Input/output constraint information calculator, using existential quantification.

10. A logic verification method, comprising:

an input step that receives an input of hardware description information concerning a design content of a hardware module and interface specification description information concerning a communication procedure of the hardware module;

a logic verifying step that carries out a logic verification of the operation of the hardware module based on the hardware description infonnation and the interface specification description information input bthe input step; and a calculating step that calculates input constraint information concerning a constraint that a signal input to the hardware module must satisfy, based on the interface specification description information input by the input step, wherein the logic verifying step canies out a logic verification of the operation of the hardware module based on the input constraint information calculated by the calculating step.

11. The logic verification method according to claim 10, further comprising;

a generating step that generates a finite state machine model concerning a status transition of signals input to and output from the hardware module, based on the interface specification description information input by the input step, wherein the calculating step calculates the input constraint information using the finite state machine model generated by the generating step.

12. A computer-readable recording medium that stores therein a computer program which causes a computer to execute a method for louic verification, the computer program causing the computer to execute:

an input step that receives an input of hardware description information concerning a design content of a hardware module and interface specification description information concerning a communication procedure of the hardware module;

a logic verifying step that carries out a logic verification of the operation of the hardware module based on the hardware description information and the interface specification description information input by the input step; and a calculating step that calculates input constraint information concerning a constraint that a signal input to the hardware module must satisfy, based on the interface specification description information input by the input step, wherein the logic verifying step carries out a logic verification of the operation of the hardware module based on the input constraint information calculated by the calculating step.

13. The computer-readable recording medium according to claim 12, the computer program further causing the computer to execute:

a generating step that generates a finite state machine model concerning a status transition of signals input to and output from the hardware module, based on the interface specification description information input by the input step, wherein the calculating step calculates the input constraint information using the finite state machine model generated by the generating step.

* * * * *

UNITED STATES PATENT AND TRADEMARK OFFICE
CERTIFICATE OF CORRECTION

PATENT NO. : 7,194,713 B2
APPLICATION NO. : 11/017730
DATED : March 20, 2007
INVENTOR(S) : Hiroaki Iwashita It is certified that error appears in the above-identified patent and that said Letters Patent is hereby corrected as shown below:

Title Page, Item (73) Assignee: change "Kawaskai" to --Kawasaki--.

Column 17, Line 7, change "donstraint" to --constraint--.

Column 17, Line 11, change "canies" to --carries--.

Column 17, Line 32, change "change;" to --change pattern;--.

Column 17, Line 53, after "satisfy" insert --,--.

Column 17, Line 60, change "calculated;" to --calculator;--.

Column 17, Line 65, change "wherein;" to --wherein:--.

Column 18, Line 9, after "quantification;" delete "and".

Column 18, Line 10, change "calcutator" to --calculator--.

Column 18, Line 24, change "The" to --the--.

Column 18, Line 33, after "satisfy" insert --,--.

Column 18, Line 40, change "The" to --the--.

Column 18, Line 46, change "quantification:" to --quantification--.

Column 18, Line 60, change "variabler;" to --variable--.

Column 19, Line 20, change "Input" to --input--.

Column 19, Line 31, change "infonnation" to --information--.

Column 19, Line 32, change "bthe" to --by the--.

Column 19, Line 39, change "canies" to --carries--.

Column 19, Line 44, change "comprising;" to --comprising:--.

UNITED STATES PATENT AND TRADEMARK OFFICE
CERTIFICATE OF CORRECTION

PATENT NO. : 7,194,713 B2
APPLICATION NO. : 11/017730
DATED : March 20, 2007
INVENTOR(S) : Hiroaki Iwashita It is certified that error appears in the above-identified patent and that said Letters Patent is hereby corrected as shown below:

Column 20, Line 11, change "louic" to --logic--.

Signed and Sealed this

Twenty-sixth Day of June, 2007

JON W. DUDAS
*Director of the United States Patent and Trademark Office*